United States Patent
Chen et al.

(10) Patent No.: US 8,313,664 B2
(45) Date of Patent: Nov. 20, 2012

(54) EFFICIENT AND ACCURATE METHOD FOR REAL-TIME PREDICTION OF THE SELF-BIAS VOLTAGE OF A WAFER AND FEEDBACK CONTROL OF ESC VOLTAGE IN PLASMA PROCESSING CHAMBER

(75) Inventors: Zhigang Chen, San Jose, CA (US); Shahid Rauf, Pleasanton, CA (US); Walter R. Merry, Sunnyvale, CA (US); Leonid Dorf, Santa Clara, CA (US); Kartik Ramaswamy, San Jose, CA (US); Kenneth S. Collins, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 309 days.

(21) Appl. No.: 12/623,243

(22) Filed: Nov. 20, 2009

(65) Prior Publication Data

US 2010/0136793 A1 Jun. 3, 2010

Related U.S. Application Data

(60) Provisional application No. 61/116,883, filed on Nov. 21, 2008.

(51) Int. Cl.
*G01L 21/30* (2006.01)
(52) U.S. Cl. ......................................... 216/59; 361/234
(58) Field of Classification Search ........................ None
See application file for complete search history.

(56) References Cited

U.S. PATENT DOCUMENTS

2006/0256499 A1* 11/2006 Yang et al. ................... 361/234
* cited by examiner

*Primary Examiner* — Binh X Tran
*Assistant Examiner* — David Cathey, Jr.
(74) *Attorney, Agent, or Firm* — Patterson & Sheridan, LLP

(57) ABSTRACT

In a plasma reactor having an electrostatic chuck, wafer voltage may be determined from RF measurements at the bias input using previously determined constants based upon transmission line properties of the bias input, and this wafer voltage may be used to accurately control the DC wafer clamping voltage.

8 Claims, 9 Drawing Sheets

EFFICIENT AND ACCURATE METHOD FOR REAL-TIME PREDICTION OF THE SELF-BIAS VOLTAGE OF A WAFER AND FEEDBACK CONTROL OF ESC VOLTAGE IN PLASMA PROCESSING CHAMBER

CROSS-REFERENCE TO RELATED APPLICATION

This application claims benefit of U.S. Provisional Application Ser. No. 61/116,883 filed Nov. 21, 2008, which is incorporated by reference in its entirety.

BACKGROUND

1. Field

Embodiments disclosed herein generally relate to plasma etching.

2. Description of Related Art

A plasma reactor for processing a semiconductor wafer typically holds the wafer inside the reactor chamber using an electrostatic chuck (ESC). Plasma ion energy at the wafer surface is controlled by applying a bias voltage to the wafer through the ESC. The ESC essentially consists of an insulator layer having a top surface for supporting the wafer. An electrode or conductive mesh inside the insulator layer beneath the wafer receives a D.C. voltage, creating a voltage drop across the insulator layer between the electrode and the wafer. The voltage drop produces an electrostatic force clamping the wafer to the ESC. The clamping force is determined by the difference between the time-average of the wafer voltage and the D.C. voltage applied to the ESC electrode. The clamping voltage may be accurately controlled (by accurately controlling the D.C. supply voltage) in order to avoid an insufficient clamping voltage or an excessive clamping voltage. An insufficient clamping voltage would allow the wafer to pop off of the ESC. An excessive clamping voltage would increase the current through the wafer to a level that risks damaging the circuit features formed on the wafer surface.

Current flows from the ESC electrode through the dielectric layer to the wafer and returns through the plasma in the chamber. The stronger the clamping force, the greater the conductivity between the wafer and the ESC, and therefore the greater the current through the wafer. In order to accurately control the clamping voltage, the wafer D.C. voltage should be measured accurately. An error in wafer voltage measurement may lead to wafer pop off or to excessive ESC-wafer current.

Use of ESC-wafer contact to control the wafer temperature imposes even more difficulties for accurate control of clamping voltage. For example, the ESC may be heated or cooled so that the wafer is either heated or cooled at a rate determined by the ESC clamping force. The wafer temperature may therefore be accurately set and controlled as a function of the clamping force. In fact, the heat transfer rate may be so great as the clamping voltage is increased, that the wafer temperature may be maintained under much higher heat load than was formerly possible. Wafer bias power may be increased beyond previously permitted levels.

Therefore, there is a need to an apparatus and method for controlling the clamping force.

SUMMARY

In one embodiment, a plasma reactor is disclosed. The plasma reactor comprises a wafer support and an RF match network coupled to the wafer support. A first RF power source may be coupled to the RF match network and be capable of operating at a first frequency. A second RF power source may be coupled to the RF match network and be capable of operating at a second frequency different than the first frequency. The plasma reactor may also include a DC power source coupled to the wafer support and a measurement instrument coupled to the RF match network for measuring a voltage at the match network attributable to each of the first frequency and the second frequency. The plasma reactor may also include a controller capable of calculating a wafer voltage signal as a function of the measured voltage and for calculating a DC voltage at a wafer on the wafer support. The controller may also be capable of adjusting DC power applied to the wafer support from the DC power source in response to the calculated wafer voltage signal.

In another embodiment, a method of processing a wafer while controlling an electrostatic chuck clamping voltage is disclosed. The method may include applying a first RF current to the electrostatic chuck through an RF match network at a first frequency from a first RF power source. The method may also include applying a second RF current to the electrostatic chuck through the RF match network at a second frequency from a second RF power source. A DC voltage may be applied to the electrostatic chuck. A third RF current attributable to the first frequency may be measured at the match network as may a fourth RF current attributable to the second frequency. The method may also include calculating a wafer voltage at the first and second frequencies based upon the measured third and fourth currents. A DC component of the wafer voltage attributed to each frequency may be calculated. From the calculated DC components, a total DC voltage at the wafer based upon the DC component attributable to each frequency and a DC component attributable to an intermodulation of the first and second frequency may be calculated. The method may also include adjusting the applied DC voltage to maintain a predetermined difference between the applied DC voltage and the total DC voltage at the wafer.

In another embodiment, a method of processing a wafer while controlling an electrostatic chuck clamping voltage in a plasma reactor is disclosed. The method may include applying a first RF current to the electrostatic chuck through an RF match network at a first frequency from a first RF power source and applying a second RF current to the electrostatic chuck through the RF match network at a second frequency from a second RF power source. The method may also include applying DC voltage to electrostatic chuck and applying a third RF current to a gas distribution showerhead of the plasma reactor at a third frequency from a third RF power source. A fourth RF current attributable to the first frequency may be measured at the match network as may a fifth RF current attributable to the second frequency. A wafer voltage at the third frequency based upon the third current, the fourth current and the fifth current may then be calculated. The DC component of the wafer voltage attributed to the first frequency, the second frequency, and the third frequency may be calculated, and the total DC voltage at the wafer based upon the DC component attributable to each frequency may be calculated. The method may also include adjusting the applied DC voltage to maintain a predetermined difference between the applied DC voltage and the total DC voltage at the wafer.

BRIEF DESCRIPTION OF THE DRAWINGS

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments discussed herein may provide an apparatus and method for predicting the self-bias voltage of a wafer and controlling, in real-time, at least one D.C. supply voltage source such that a clamping voltage between the wafer and the ESC is maintained.

ESC with High Contact Force Wafer Cooling

Figure 1A:
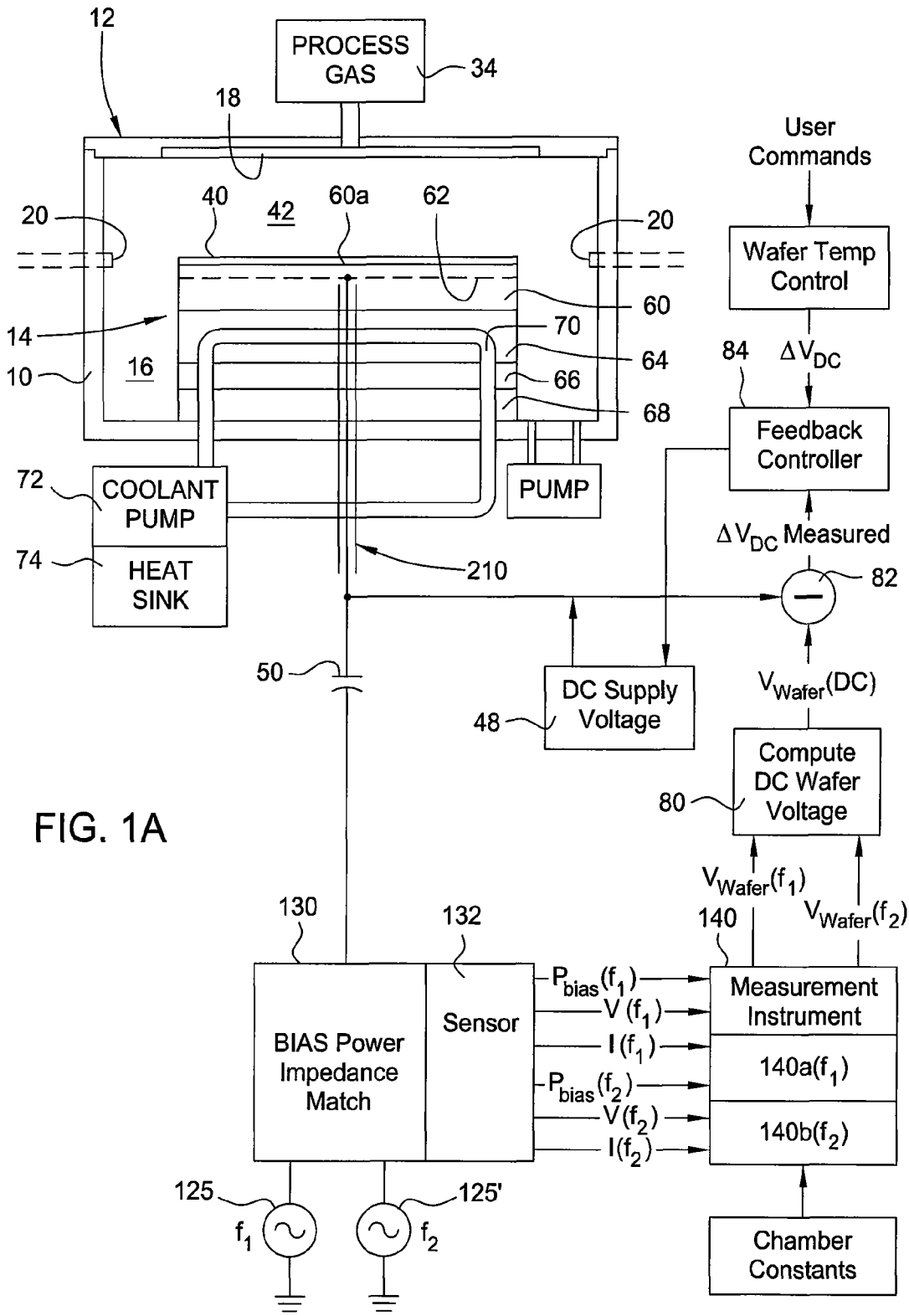
FIG. 1A illustrates a plasma reactor with a measurement instrument in an electrostatic chuck feedback control loop, the reactor having a bias voltage source with a low frequency (LF) component and a high frequency (HF) component.

FIG. 1A illustrates a plasma reactor having a cylindrical side wall 10, a ceiling 12 and a wafer contact-cooling ESC 14. A pumping annulus 16 is defined between the ESC 14 and the sidewall 10. While a wafer contact-cooling ESC 14 may be used in any type of plasma reactor or other reactor such as thermal process reactor, the reactor in the example of FIG. 1A is of the type in which process gases can be introduced through a gas distribution plate 18 or "showerhead" forming a large portion of the ceiling 12. Alternatively, the reactor could have gas distribution inlets 20 (dashed lines) that are separate from the ceiling 12. The wafer contact-cooling ESC 14 may be employed in conjunction with any plasma source, such as an inductively coupled RF plasma source, a capacitively-coupled RF plasma source, a microwave plasma source, or a torroidal plasma source. A process gas supply 34 is coupled to the gas distribution plate 18 (or to the gas injectors 20). A semiconductor wafer 40 is placed on top of the ESC 14. A processing region 42 is defined between the wafer 40 and the ceiling of the chamber 12 (including the gas distribution plate 18).

Plasma RF bias power from a low frequency RF bias power generator 125 and from a high frequency RF bias power generator 125' is applied through an impedance match circuit 130 to the ESC 14. A D.C. chucking voltage is applied to the ESC 14 from a chucking voltage source 48 isolated from the RF bias power generator 125 by an isolation capacitor 50. The RF power delivered to the wafer 40 from the RF bias power generators 125, 125' can heat the wafer 40 to temperatures beyond 400 degrees Celsius, depending upon the level and duration of the applied RF plasma bias power. It is believed that about 80% or more of the RF power is dissipated as heat in the wafer 40.

Figure 2:
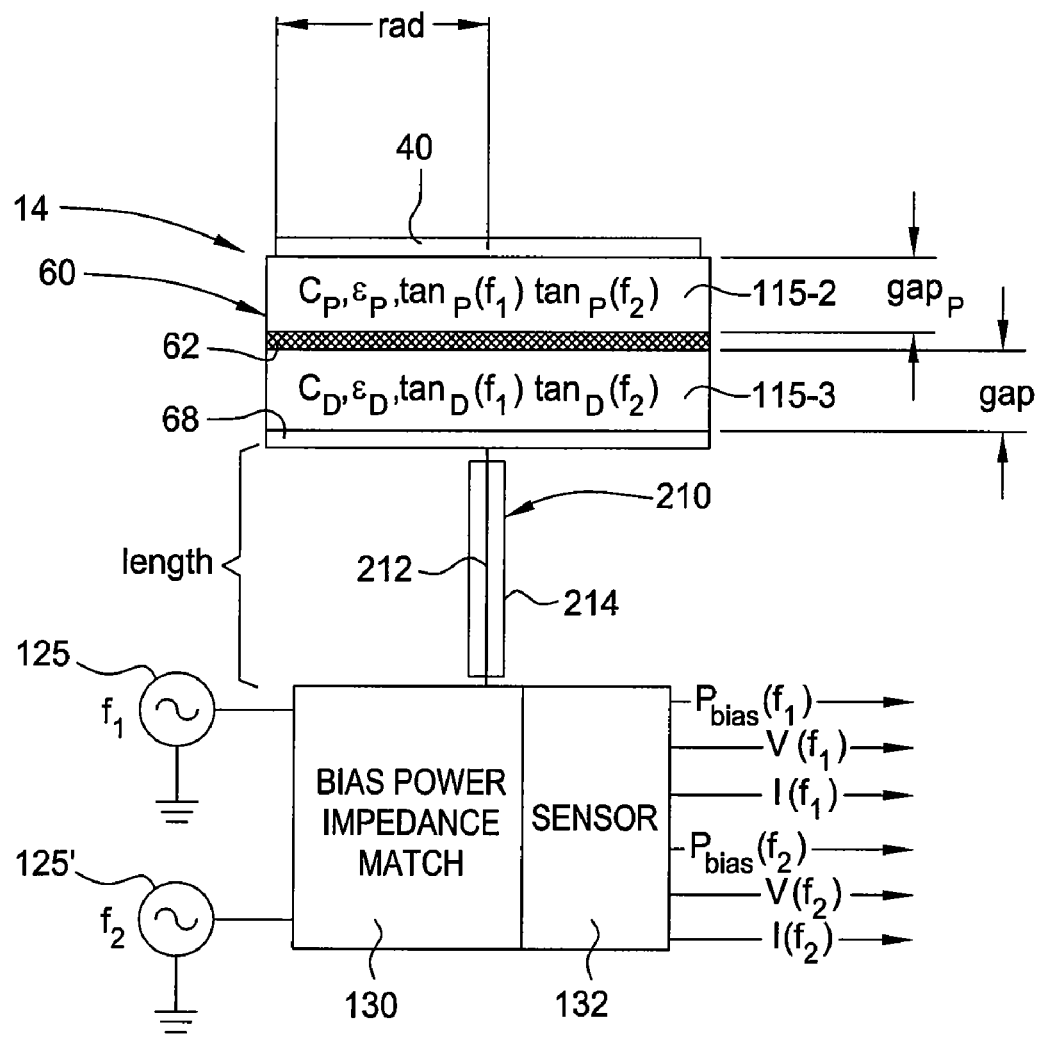
FIG. 2 illustrates an electrical model of the plasma reactor employed by the measurement instrument.

The ESC 14 of FIG. 2 is a wafer contact-cooling electrostatic chuck in which the portion of the chuck contacting the wafer is cooled. The wafer contact-cooling ESC 14 requires no gas cooling source nor internal gas coolant passages to keep the wafer cool and remove heat from the wafer (although such a feature may be included nevertheless). Instead, the heat is removed from the wafer at a rate which limits the maximum wafer temperature or the time rate of rise of the wafer temperature during plasma processing, by cooling the ESC 14 itself, while maintaining direct high-force contact between the wafer 40 and the ESC 14, as will be described shortly. Alternatively, the chucking voltage may be varied during wafer processing to vary the selected heat transfer coefficient in order to control wafer temperature to a target value. This latter feature may be carried out by monitoring the wafer temperature and varying the chuck voltage so as to minimize the difference between the measured wafer temperature and a target temperature. As the measured wafer temperature rises above a maximum target temperature, the chucking voltage is increased, and as the measured wafer temperature falls below a target minimum temperature, the chucking voltage may be decreased. Moreover, the high-force contact cooling of the wafer is able to control wafer temperature even at very high RF bias power levels.

The ESC 14 has a top layer, referred to as a puck 60, consisting of insulative or semi-insulative material, such as aluminum nitride or aluminum oxide, which may be doped with other materials to control its electrical and thermal properties. A metal (molybdenum, for example) wire mesh or metal layer 62 inside of the puck 60 forms a cathode (or electrode) to which the chucking voltage and RF bias power is applied via a coaxial cable 210. The puck 60 may be formed as a ceramic. In other embodiments, the puck 60, may be formed by plasma or physical deposition processes, chemical vapor deposition processes, plasma spray coating, flame spray coating, or other conventional methods. The puck 60 is supported on a metal layer 64, preferably consisting of a metal having a high thermal conductivity, such as aluminum. The metal layer 64 rests on a highly insulative layer 66 whose thickness, dielectric constant and dielectric loss tangent are chosen to provide the ESC 14 with selected RF characteristics (e.g., capacitance, loss resistance) compatible with the reactor design and process requirements. A metal base layer 68 is connected to ground. The wafer 40 is held on the ESC 14 by applying a D.C. voltage from the chucking voltage source 48 to the electrode 62. In the case of an insulator puck 60, the application of voltage across an insulator puck 60 may polarize the insulator puck 60 and induce an opposite (attractive) image charge in the bottom surface of the wafer 40. In the case of a semi-insulator puck 60, in addition to inducing an image charge in the bottom surface of the wafer, charge from the electrode 62 may migrate through the semi-insulator puck 60 to accumulate very close to the top surface of the semi-insulator puck 60, for a minimum gap between the charge and the overlying wafer 40. This may induce an opposite (attractive) image charge in the bottom surface of the wafer 40. The effective gap between the two opposing charge layers is so minimal as a result of the upward charge migration in the semi-insulator puck 60 that the attractive force between the ESC 14 and the wafer 40 may be very large for a relatively small applied chucking voltage. For example, a chucking voltage of only 300 volts D.C. on the electrode 62 may produce a chucking force across the wafer 40 equivalent to a pressure of about 100 Torr. The semi-insulator puck 60 may, therefore, be formed of a material having a desired charge mobility, so that the material is not a perfect insulator (hence, the term "semi-insulator"). This semi-insulator material, although not a perfect insulator, may also be a non-typical semiconductor, in some cases. In any case, the charge induced by the chucking voltage on the electrode 62 is mobile in a semi-insulator material of the puck 60, and therefore it may be said that the semi-insulator puck 60 is formed of a "charge mobile" material. One example of a material suitable for the puck semi-insulator or charge mobile puck 60 is aluminum nitride. Another example is aluminum oxide, which may optionally be doped to increase charge mobility. For example, the dopant material may be titanium dioxide.

RF bias power from the RF bias power generators 125, 125' may be applied through the impedance match circuit 130 to the electrode 62 or, alternatively, to the metal layer 64 for RF coupling through the semi-insulative puck 60.

A very high heat transfer coefficient between the wafer 40 and the puck 60 is realized by maintaining a very high chucking force. A suitable range for this force depends upon the anticipated heat loading of the wafer and will be discussed later in this specification. The heat transfer coefficient (having units of Watts/m$^2$*K or heat flux density for a given temperature difference) of the wafer-to-puck contacting surfaces is adequate to remove heat at the rate heat is conducted to the wafer. Specifically, the heat transfer coefficient is adequate because during plasma processing it either limits the wafer temperature below a specified maximum temperature or limits the time rate of rise of the wafer temperature below a maximum rate of rise. The maximum wafer temperature may be selected to be anywhere in a practical range from on the order to 100 degrees Celsius or higher, depending upon the heat load. The maximum rate of heat rise during processing may be anywhere in a range from 3 to 20 degrees per second. Specific examples may be 20 degrees per second, or 10 degrees per second or 3 degrees per second. By comparison, if the wafer is un-cooled, the rate of heat rise may be 86.7 degrees per second in the case of a typical 300 mm silicon wafer with a heat load of 7500 Watts, 80% of which is absorbed by the wafer. Thus, the rate of temperature rise is reduced to one-fourth of the un-cooled rate of heat rise in one embodiment.

Such performance is accomplished, first, by maintaining the puck at a sufficiently low temperature (for example, about 80 degrees Celsius below the target wafer temperature), and second, by providing the top surface of the puck 60 with a sufficiently smooth finish (e.g., on the order of ten's of micro-inches RMS deviation, or preferably on the order of micro-inches RMS deviation). For this purpose, the top surface 60a of the puck 60 can be highly polished to a finish on the order of about 2 micro-inches RMS deviation, for example. Furthermore, heat is removed from the puck 60 by cooling the metal layer 64. For this reason, internal coolant passages 70 are provided within the metal layer 64 coupled to a coolant pump 72 and heat sink or cooling source 74. In an alternative embodiment, the internal cooling passages 70 may extend into the puck 60 or adjacent its back surface in addition to or instead of extending through the metal layer 64. In any case, the coolant passages 70 are thermally coupled to the puck 60, either directly or through the metal layer 64, and are for cooling the puck 60. The coolant liquid circulating through the internal passages 70 can be water, ethylene glycol or a mixture, for example. Alternatively, the coolant may be a perfluorinated heat transfer liquid such as "fluorinert" (made by 3M Company). Unlike the internal gas coolant passages of conventional chucks, this feature presents little or no risk of arcing in the presence of high RF bias power applied to the ESC 14 by the RF bias power generator 125.

One advantage of such contact-cooling of the wafer over the conventional method employing a coolant gas is that the thermal transfer efficiency between the coolant gas and each of the two surfaces (i.e., the puck surface and the wafer bottom surface) is very limited, in accordance with the thermal accommodation coefficient of the gas with the materials of the two surfaces. The heat transfer rate is attenuated by the product of the gas-to-wafer thermal accommodation coefficient and the gas-to-puck thermal accommodation coefficient. If both coefficients are about 0.5 (as a high rough estimate), then the wafer-gas-puck thermal conductance is attenuated by a factor of about 0.25. In contrast, the contact-cooling thermal conductance in the embodiments discussed herein have virtually no such attenuation. The thermal accommodation coefficient being in effect unity for the ESC 14 of FIGS. 1A-4. Therefore, the contact cooling ESC 14 can outperform conventional electrostatic chucks (i.e., electrostatic chucks that that employ gas cooling) by a factor of about four (or more) with sufficiently high attractive electrostatic force between wafer and puck.

The heat transfer coefficient between the wafer 40 and the puck 60 in the wafer contact-cooling ESC 14 is affected by the puck top surface finish and the chucking force. These parameters can be adjusted to achieve the requisite heat transfer coefficient for a particular environment. An important environmental factor determining the required heat transfer coefficient is the applied RF bias power level. It is believed that at least 80% of the RF bias power from the bias generator 125 is dissipated as heat in the wafer 40. Therefore, for example, if the RF bias power level is 7500 Watts and 80% of the RF bias power from the bias generator 125 is dissipated as heat in the wafer 40, if the wafer area is 706 cm$^2$ (300 mm diameter wafer) and if a 80 degrees Celsius temperature difference is allowed between the wafer 40 and the puck 60, then the required heat transfer coefficient is h=7500*80% Watts/(706 cm$^2$*80 degrees K), which is 1071 Watts/m$^2$ K. For greater RF bias power levels, the heat transfer coefficient can be increased by augmenting any one or both of the foregoing factors, namely the temperature drop across the puck, the chucking force or the smoothness of the puck surface. Such a high heat transfer coefficient, rarely attained in conventional electrostatic chucks, is readily attained in the ESC 14 of FIG. 2 by applying a sufficiently high chucking voltage, on the order of 1 kV, for example.

In addition, the heat transfer is improved by providing more puck surface area available for direct contact with the wafer backside. In a conventional chuck, the puck surface available for wafer contact is greatly reduced by the presence of open coolant gas channels machined, ground or otherwise formed in the puck surface. These channels occupy a large percentage of the puck surface.

Dual Bias Power Frequencies for Enhanced Etch Performance

The reactor of FIG. 1A may employ two different bias power frequencies, namely $f_1$ and $f_2$, in order to optimize etch performance. The first bias frequency $f_1$ is a low frequency (LF) RF signal, such as 2 MHz, and is sufficiently low for ions at the plasma sheath to follow the oscillations of its electric field. Since some of the ions that are in phase with the LF electric field will be accelerated across the sheath while other ions that are out of phase with the LF electric field will be decelerated across the plasma sheath, the LF bias source provides a relatively wide spectrum of ion energy. For example, for a nominal RF bias level of 1000 volts at 2 MHz, the ion energy will range from about 300 eV to 1800 eV. The second bias frequency $f_2$ is a high frequency (HF) RF signal that is too high to be followed by ions at the plasma sheath, so that the ion energy distribution produced by the HF bias source is relatively narrow and is centered at an average value corresponding to half the peak-to-peak voltage. The combination of the narrow ion energy distribution of the HF bias source (of frequency $f_2$) and the broad ion energy distribution of the LF bias source (of frequency $f_1$) produces an ion energy distribution extending from the average ion energy level generated by the HF bias source to the higher ion energy levels generated by the LF bias source. It is believed that such higher ion energy levels enhance etch performance. The problem is that intermodulation products between the two bias frequencies, $f_1$ and $f_2$, make it seemingly impossible to accurately measure the net wafer voltage.

Wafer Contact Force Feedback Control

Conventional sensing circuits 132 within the impedance match circuit 130 have output terminals providing signals indicating, respectively, the low frequency voltage $V(f_1)$, current $I(f_1)$ and (optionally) power $P_{bias}(f_1)$, and the high frequency voltage $V(f_2)$, current $I(f_2)$ and (optionally) power $P_{bias}(f_2)$ furnished at the output of the impedance match circuit 130 to the ESC 14. A measurement instrument 140 uses the signals from the output terminals to measure the voltage on the wafer 40. The measurement instrument 140 employs processes based upon an electrical model of the reactor discussed below. A processor 80 periodically computes the D.C. voltage of the wafer 40. A subtractor 82 computes the net chucking voltage as the difference between the D.C. wafer voltage and the D.C. voltage applied to the ESC 14 by the chucking voltage source (i.e., the D.C. voltage supply) 48. A feedback controller 84 compares the net chucking voltage provided by the subtractor 82 with a desired net chucking voltage to determine an error, and applies a corrective signal to change the D.C. output of the D.C. voltage supply 48 so as to reduce this error. The desired net chucking voltage may be furnished by a wafer temperature control processor that translates a user-commanded wafer temperature to a desired net chucking voltage.

Figure 1B:
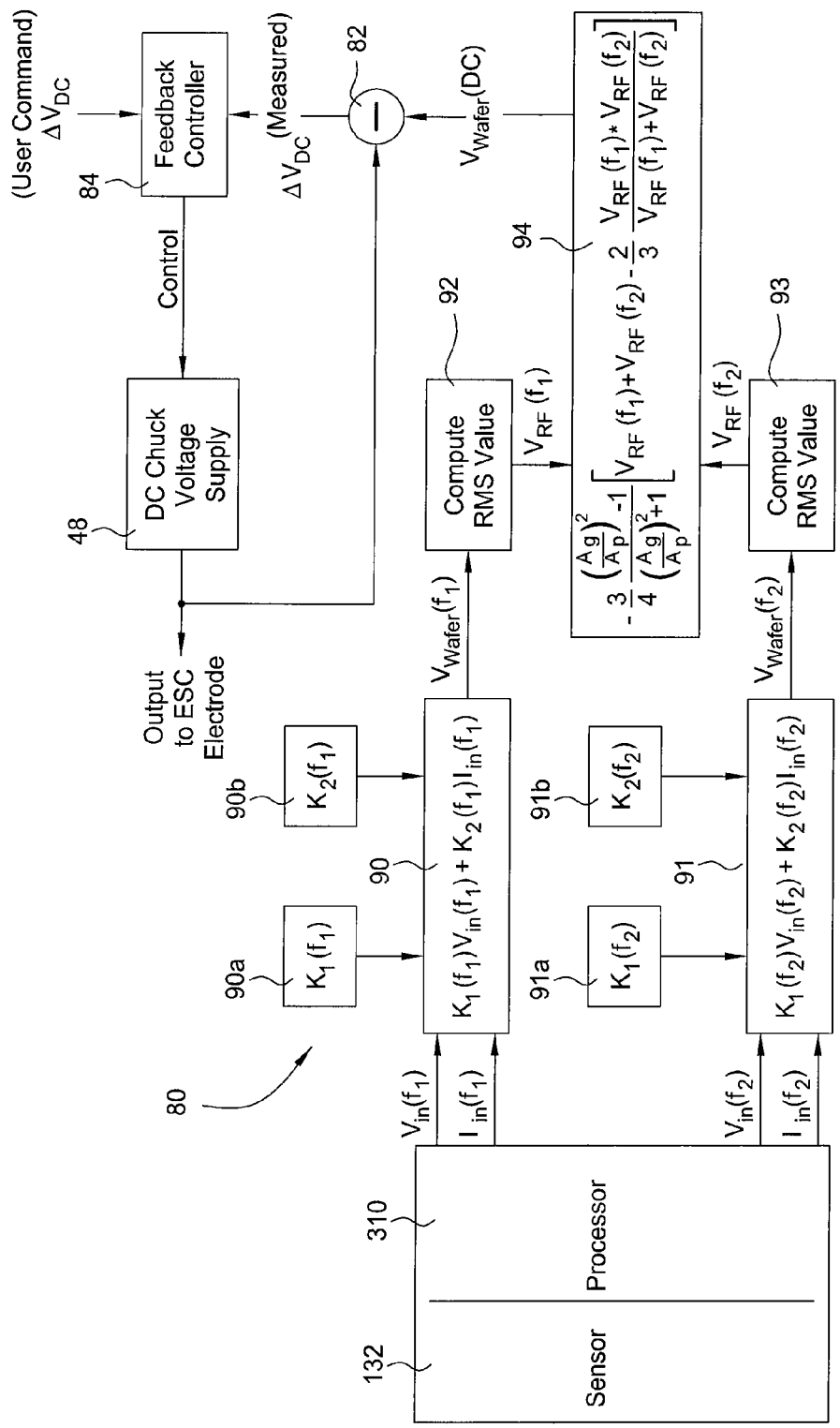
FIG. 1B is a block diagram of apparatus within the measurement instrument for determining wafer voltage based upon the HF and LF components of the bias supply voltage and current for the feedback control loop.

Measurement of the Wafer Voltage with a Correction for Intermodulation Products of $f_1$ and $f_2$ Referring to FIG. 1B, a processor 90 may determine the voltage $V_{junction}$ at the electrode or grid 62 by multiplying the voltage $V_{in}$ and current $I_{in}$ measured at the input to the cable 210 by respective constants and summing the two products. In some embodiments, this multiplication and summing may take the form described by Equation 1:

$$V_{junction} = V_{in} * \cos h[(V_{CH})(-\text{length})] + I_{in} * Z_{CH} * \sin h[(V_{CH})(-\text{length})] \quad (1),$$

such that one constant is $\cos h[(V_{ch})(-\text{length})]$ and the other constant is $Z_{ch} * \sin h[(V_{ch})(-\text{length})]$. These two constants are referred to herein as $K_1$ and $K_2$, respectively. $Z_{ch}$ may be described as the characteristic impedance of the coaxial cable 210, while $V_{ch}$ may be described as the complex phase velocity of the cable 210, and "length" is the cable length. The voltage $V_{wafer}$ at the wafer 40 may be obtained by incorporating into each of the constants a correction factor $Z_{wafer}/Z_{grid}$, in accordance with the operation of the processor 520 of FIG. 5A and the processor 830 of FIG. 8A. $Z_{wafer}$ is the impedance between the grid 62 and the wafer, while $Z_{grid}$ is the impedance between the grid 62 and ground. With the correction factor incorporated into the constants, they become as follows: $K_1 = (Z_{wafer}/Z_{grid}) * \cos h[(V_{ch})(-\text{length})]$ $K_2 = (Z_{wafer}/Z_{grid}) * Z_{ch} * \sin h[(V_{ch})(-\text{length})]$.

The foregoing may be valid for a single bias frequency wherein each of the parameters $Z_{wafer}$, $Z_{grid}$ and $V_{ch}$ is evaluated at the particular bias frequency, so that $K_1$ and $K_2$ depend upon frequency.

In embodiments of the present disclosure, there may be two bias sources 125, 125' providing bias power at the LF frequency $f_1$ and at the HF frequency $f_2$, respectively, as illustrated in FIG. 1A. Therefore, two processors 90 and 91 of FIG. 1B may separately compute the wafer voltages at the respective bias frequencies $f_2$, employing the constants $K_1$, $K_2$ evaluated at the different bias frequencies, as follows: $K_1(f_1)$, $K_2(f_1)$, $K_1(f_2)$, $K_2(f_2)$. The measurement instrument 132 provides the LF input voltage $V_{in}(f_1)$ and input current $I_{in}(f_1)$ to the processor 90 and the HF input voltage $V_{in}(f_2)$ and input current $I_{in}(f_2)$ to the processor 92. The LF processor 90 may employ the LF constants $K_1(f_1)$, $K_2(f_1)$ while the HF processor 91 may employ the HF constants $K_1(f_2)$, $K_2(f_2)$, to produce the LF wafer voltage $V_{wafer}(f_1)$ and the HF wafer voltage $V_{wafer}(f_2)$, respectively. The two RF wafer voltages, $V_{wafer}(f_1)$ and $V_{wafer}(f_2)$, may then be used to determine the measured D.C. wafer voltage as follows. First, wafer RF voltages at the two frequencies, $V_{RF}(f_1)$, $V_{RF}(f_2)$ are determined as the magnitudes of the LF and HF wafer voltages, $V_{wafer}(f_1)$, $V_{wafer}(f_2)$, by processors 92, 93, respectively. After determining the wafer RF voltages at the two frequencies, $V_{RF}(f_1)$ and $V_{RF}(f_2)$, the D.C. voltage on the wafer is determined.

However, in determining the D.C. voltage on the wafer attributable to both frequency components $V_{wafer}(DC)$, significant errors have been found when a simple addition of the two frequency components, $V_{wafer}(f_1) + V_{wafer}(f_2)$ has been employed. This is because such a simple addition does not take into account the effects of coupling between the two bias frequencies. As discussed earlier in this specification, the error can exceed the capacity of the chucking D.C. voltage supply 48. Therefore, a more sophisticated approach may be taken. For example, when determining the D.C. voltage on the wafer in a dual frequency setting, a processor 94 may employ Equation 2:

$$V_{wafer}(DC) = -\frac{3}{4} * \frac{\left(\frac{A_g}{A_p}\right)^2 - 1}{\left(\frac{A_g}{A_p}\right)^2 + 1} \left[ \frac{V_{RF}(f_1) + V_{RF}(f2) -}{\frac{2}{3} \frac{V_{RF}(f_1) * V_{RF}(f_2)}{V_{RF}(f_1) + V_{RF}(f_2)}} \right], \quad (2)$$

where $A_g$ represents the area of the grounded electrode (i.e., the ceiling of the chamber 12) and $A_p$ represents the area if the powered electrode (i.e., the ESC 14).

This may provide a highly accurate measurement of the D.C. voltage on the wafer, $V_{wafer}(DC)$, which is the input to the feedback control loop including elements 82, 84, 48 governing the ESC clamping force applied to the wafer. The subtractor 82 determines the net wafer clamping voltage, $\Delta V_{DC}$, as the difference between the measured D.C. wafer voltage from the processor 80, $V_{wafer}(DC)$, and the D.C. voltage output by the D.C. chuck voltage supply 48. The feedback controller 84 may compare this value with a desired clamping voltage to determine an error, and changes the output of the ESC D.C. voltage supply 48 so as to reduce this error.

Measurement of the Wafer Voltage Based Upon the Electrical Characteristics of the Chamber FIG. 2 depicts an electrical model of the plasma reactor of FIG. 1A that defines electrical parameters of the certain reactor components used in the measurement instrument 140 to determine voltage on the wafer 40 from RF voltage and current at the output of the impedance match 130. In the model of FIG. 2, the ESC 14 includes the dielectric puck 60 containing the electrode or conductive grid 62, the puck 60 being divided by the electrode 62 into a thin overlying dielectric layer 115-2 and an underlying dielectric layer 115-3. The layer 115-3 can model the combination of the layers of the puck 60 (lower portion), 64 and 66 that separate the electrode 62 from the grounded metal base 68. FIG. 2 also shows the coaxial cable 210 connecting the output of the impedance match circuit 130 to the grid 62. The coaxial cable 210 has an inner conductor 212 and an outer conductor 214.

The electrical model depicted in FIG. 2 characterizes the electrical properties of the plasma reactor, which are readily determined using conventional techniques. Specifically, the coaxial transmission line or cable 210 may be characterized by three quantities: (1) its length, (2) its characteristic impedance $Z_{ch}$, and (3) its complex phase velocity $V_{ch}$, in the transmission line equation. Since the complex phase velocity $V_{ch}$ depends upon the frequency of the signal propagating through the coaxial cable, it may be referred to herein as $V_{ch}(f)$ in order to indicate its dependency upon frequency. The ESC 14 is characterized by electrical properties of the overlying and underlying dielectric layers 115-2 and 115-3. Specifically, the underlying dielectric layer 115-3 has a capacitance $C_D$, which is a function of (1) the dielectric constant, $\in_D$, of the dielectric layer 115-3, and (2) the conductive loss component of the dielectric layer 115-3, $\tan_D$, (3) the thickness, gap, of the dielectric layer 115-3, and (4) the radius of the wafer 40. The conductive loss component $\tan_D$ depends upon the frequency of the signal being coupled through the dielectric layer, and therefore it will be referred to herein as $\tan_D(f)$ in order to indicate its dependency upon frequency. The overlying dielectric layer 115-2 has a capacitance $C_P$ which is a function of (1) the thickness, $gap_P$, of the dielectric layer 115-2, (2) the dielectric constant, $\in_P$, of the dielectric layer 115-2 and (3) the conductive loss component of the dielectric layer 115-2, $\tan_P$. The conductive loss component $\tan_P$ may depend upon the frequency of the signal being coupled through the dielectric layer, and therefore may be referred to herein as $\tan_P(f)$ in order to indicate its dependency upon frequency.

Figure 3:
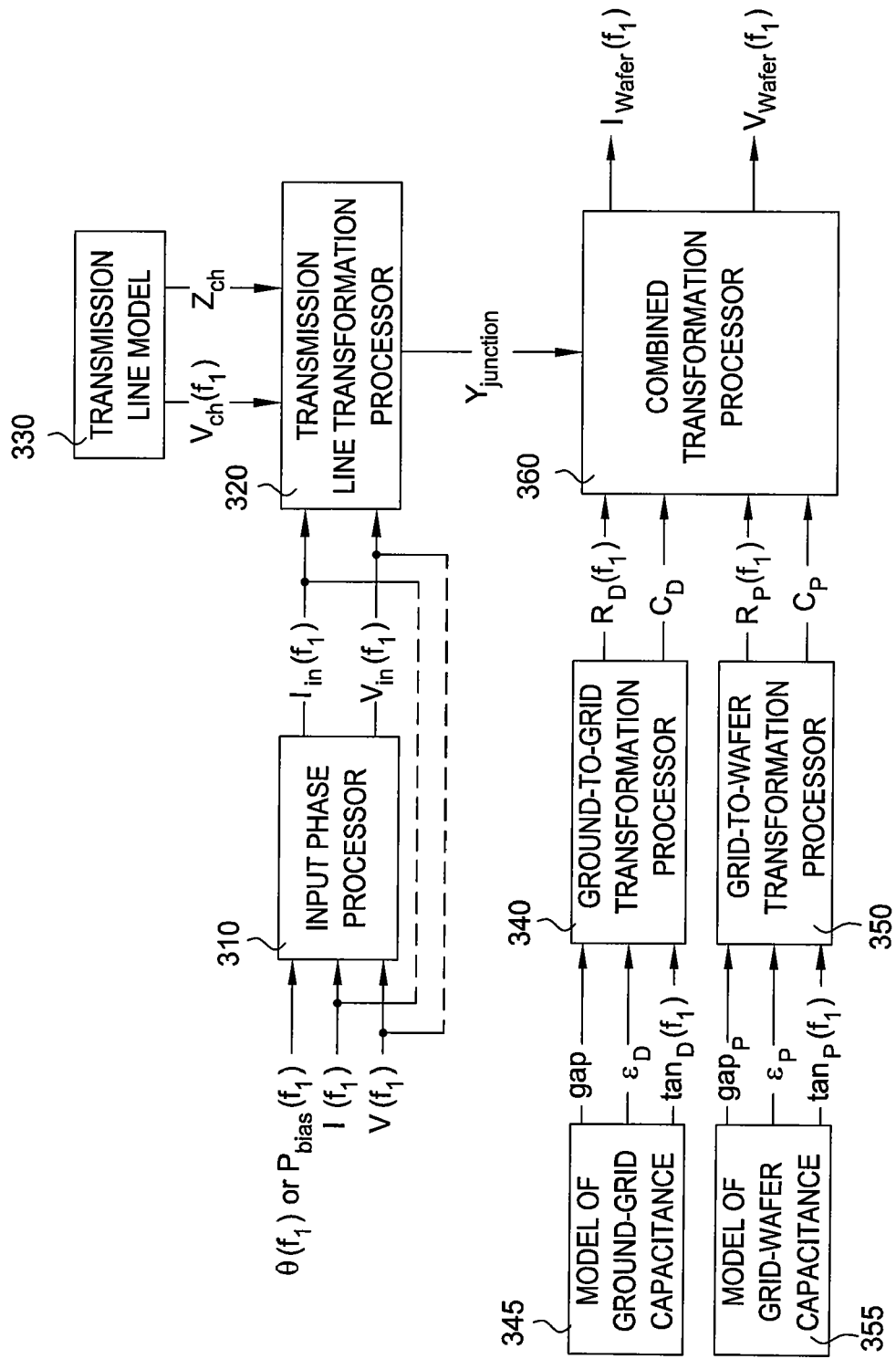
FIG. 3 illustrates an embodiment of the structure of the LF section of the measurement instrument of FIG. 1.

In one implementation, the measurement instrument 140 of FIG. 1A can be divided into two sections 140a, 140b, dedicated to the measurement of the respective components of the wafer voltage at the frequencies $f_1$, $f_2$, respectively. For this purpose, the output signals from the sensor 132 pertaining to the LF components (i.e., $V(f_1)$, $P(f_1)$) may be provided to the measurement instrument section 140a, while the output signals from the sensor 132 pertaining to the HF components (i.e., $V(f_1)$, $I(f_1)$, $P(f_1)$) may be provided to the measurement instrument section 140b. The two sections 140a, 140b may, therefore, employ different values of the frequency-dependent model parameters referred to above. Thus, the measurement instrument section 140a may use $V_{ch}(f_1)$, $\tan_D(f_1)$, and $\tan_D(f_1)$, which are the values of these frequency-dependent parameters evaluated at the LF frequency $f_1$. Likewise, the measurement instrument section 140b may use $V_{ch}(f_2)$, $\tan_D(f_2)$, and $\tan_P(f_2)$, which are the values of these frequency-dependent parameters evaluated at the HF frequency $f_2$. FIG. 3 illustrates embodiments of the structure of the respective measurement instrument sections 140a, 140b of FIG. 1A.

The LF Measurement Instrument Section 140a

Referring to FIG. 3, in the measurement instrument section 140a, an input phase processor 310 may receive the low frequency (LF) $P_{bias}(f_1)$, $V(f_1)$, and $I(f_1)$ signals from the impedance match sensing circuit 132 of FIG. 1A and produce respective signals indicating an LF input current $I_{in}(f_1)$ and an LF input voltage $V_{in}(f_1)$ at the near end of the coaxial cable 210 (i.e., the end nearest the impedance match circuit 130). In some embodiments, the input phase processor 310 may not be employed, so that the LF input current and voltage, $I_{in}(f_1)$, $V_{in}(f_1)$, are the same as the LF voltage and current, $V(f_1)$, $I(f_1)$, from the sensor 132. This simplification avoids the complications of computing phase as is done in the processor 310. A transmission line transformation processor 320 may use the characteristic impedance $Z_{ch}$ and the complex phase velocity or loss coefficient $V_{ch}(f_1)$ from a transmission line model 330 of the coaxial cable 210 to transform from $I_{in}$ and $V_{in}$ at the near cable end to a voltage $V_{junction}$ at the far cable end, i.e., at the junction between the coaxial cable 210 and the grid 62. A grid-to-ground transformation processor 340 may take a radius, gap, dielectric constant $\in_D$, and $\tan_D(f_1)$ from a model 345 of the grid-to-ground capacitance and produces a dielectric resistance $R_D(f_1)$ and dielectric capacitance $C_D$. A grid-to-wafer transformation processor 350 may take a radius, $gap_P$, dielectric constant $\in_P$, and $\tan_P(f_1)$ from a model 355 of the grid-to-wafer capacitance and produces a plasma resistance $R_P(f_1)$ and a plasma capacitance $C_P$. A combined transformation processor 360 may then accept the outputs of the processors 320, 340, 350 and compute the wafer voltage $V_{wafer}(f_1)$.

In summary, electrical measurements may be made at the output of the impedance match circuit 130. The transmission line transformation processor 320 transforms these measurements at the near end of the cable 210 to a voltage at the far end. The grid-to-ground transformation processor 340 may provide the transformation from the ground plane 64 near the far end of the cable to the conductive grid 62. And, the grid-to-wafer transformation processor 350 may provide the transformation from the conductive grid 62 to the wafer 40.

The transmission line model 330, the model of the grid-to-ground capacitance 345, and the model 355 of the grid-to-wafer capacitance are not necessarily a part of the measurement instrument 140. In some embodiments, they may be memories within the measurement instrument 140 that store, respectively, the coaxial cable parameters (e.g., $V_{ch}(f_1)$ and $Z_{ch}$), the grid-to-ground capacitance parameters (e.g., gap, dielectric constant $\in_D$, $\tan_D(f_1)$ and radius) and the grid-to-wafer capacitance parameters (e.g., $gap_P$, dielectric constant $\in_P$, $\tan_P(f_1)$, and radius).

Figure 4:
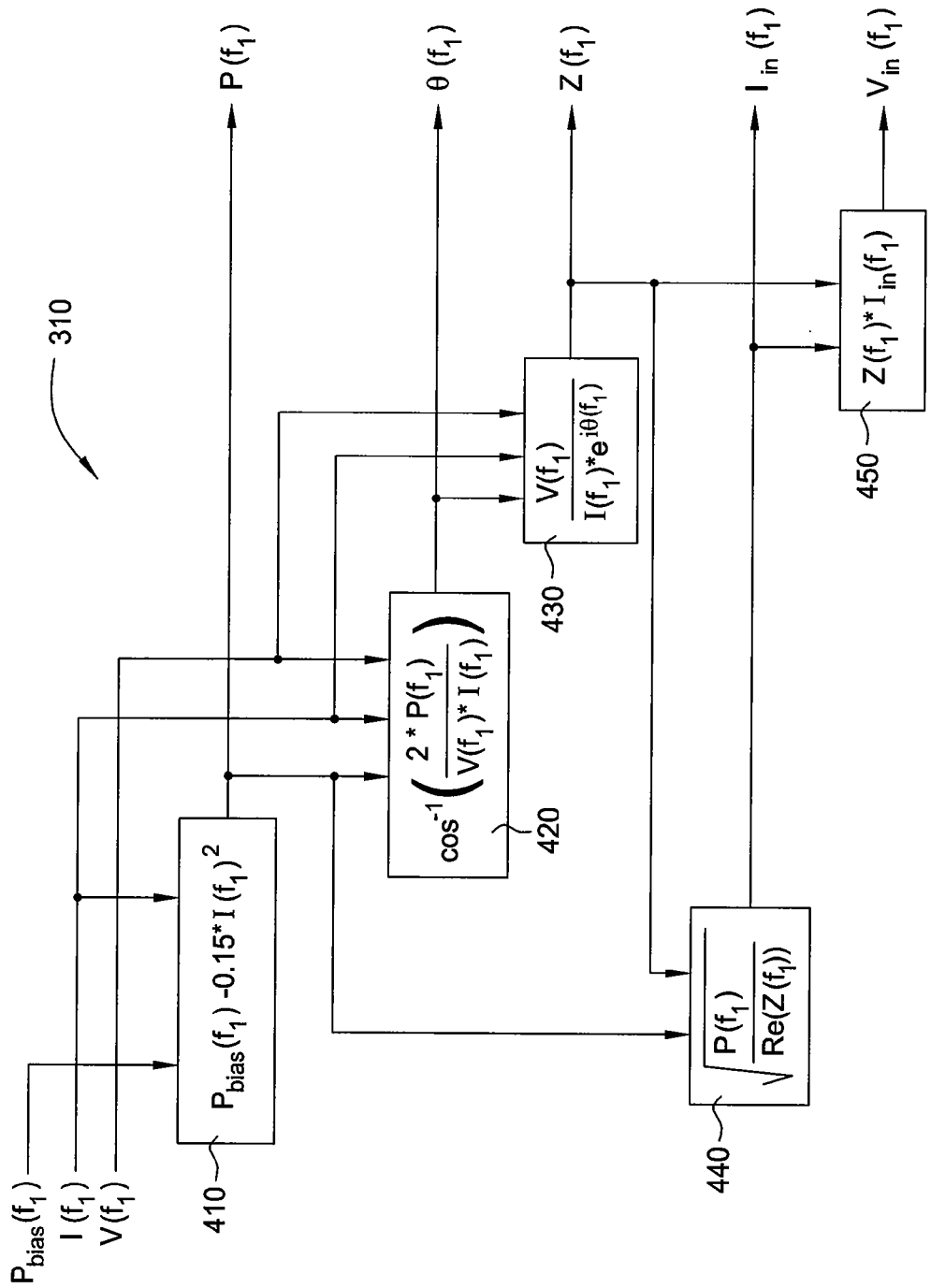
FIG. 4 illustrates an embodiment of an input phase processor of the LF measurement instrument section of FIG. 3.

FIG. 4 illustrates an embodiment of the structure of the input phase processor 310 of FIG. 3. A delivered power arithmetic logic unit (ALU) 410 may compute delivered power $P(f_1)$ from the outputs $I(f_1)$ and $P_{bias}(f_1)$ of the impedance match sensing circuit 132 as described by Equation 3:

$$P(f_1) = P_{bias}(f_1) - 0.15 * I(f_1)^2 \quad (3).$$

A phase angle ALU 420 may then compute a phase angle $\theta(f_1)$ from the delivered power $P(f_1)$ and from $V(f_1)$ and $I(f_1)$ as described by Equation 4:

$$\Theta(f_1) = \cos^{-1}\left(\frac{2 * P(f_1)}{V(f_1) * I(f_1)}\right). \quad (4)$$

Additionally, an impedance ALU 430 of the input phase processor 310 may compute the complex impedance $Z(f_1)$ as described by Equation 5:

$$Z(f_1) = \frac{V(f_1)}{I(f_1) * e^{i\theta(f_1)}}, \tag{5}$$

where $i=(-1)^{1/2}$. Then, an input current ALU 440 may determine the input current $I_{in}(f_1)$ to the coaxial cable 210 by taking the square root of the quotient of the delivered power $P(f_1)$ divided by the real portion of the complex impedance $Z(f_1)$, as described by Equation 6:

$$I_{in}(f_1) = \sqrt{\frac{P(f_1)}{\text{Re}(Z(f_1))}}. \tag{6}$$

Utilizing the complex impedance $Z(f_1)$ and the input current $I_{in}(f_1)$, an input voltage ALU 450 may determine the input voltage $V_{in}(f_1)$ to the coaxial cable 210 as described by Equation 7:

$$V_{in}(f_1) = Z(f_1) * I_{in}(f_1) \tag{7}.$$

Figure 5:
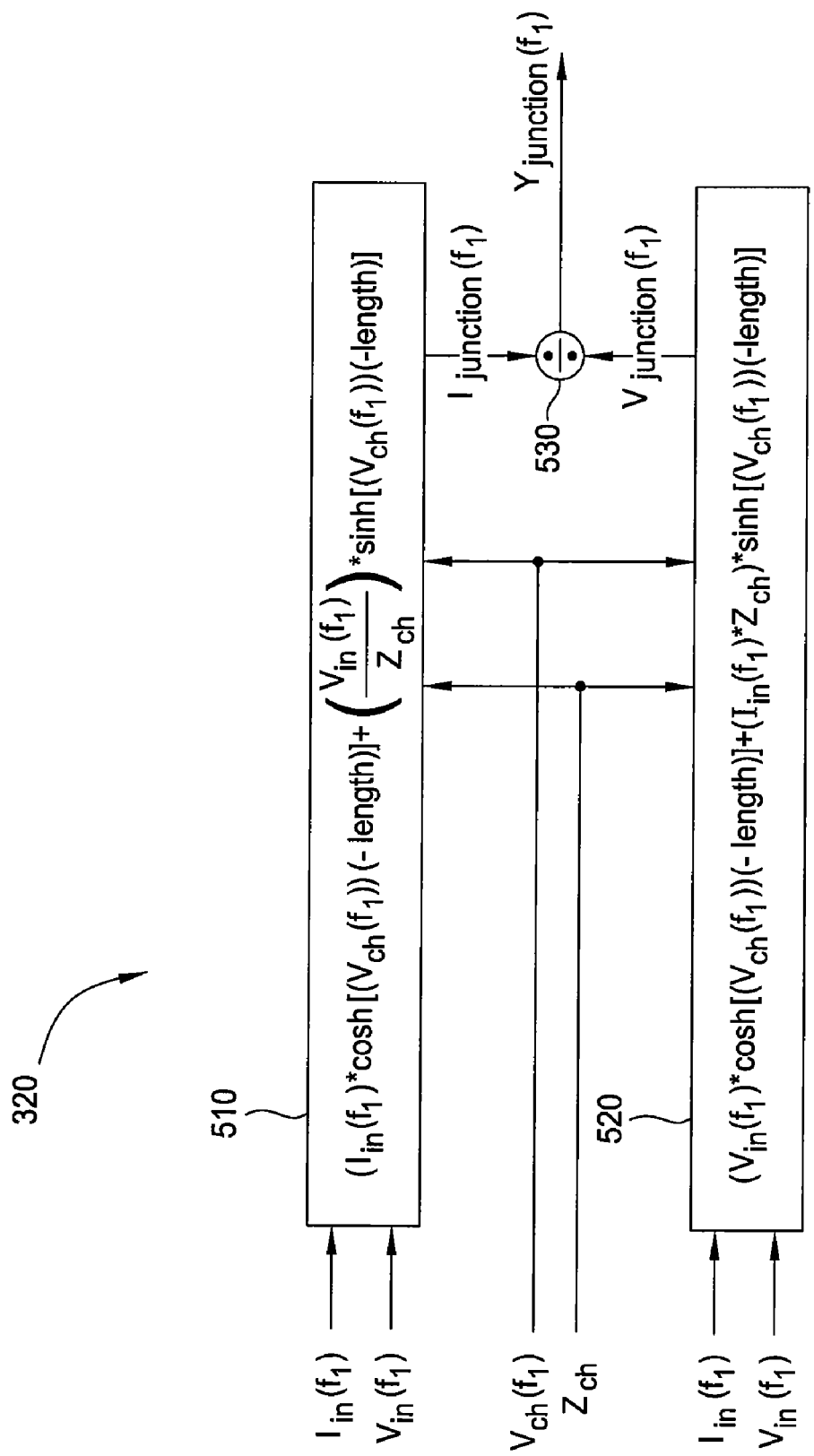
FIG. 5 illustrates an embodiment of a transmission line transformation processor in the measurement instrument LF section of FIG. 3.

FIG. 5 illustrates an embodiment of the structure of the transmission line transformation processor 320 of FIG. 3. The transmission line processor 320 may receive an input current $I_{in}(f_1)$ and an input voltage $V_{in}(f_1)$ as inputs from the input phase processor 310 of FIG. 4 and use the transmission line model parameters $V_{ch}(f_1)$ and $Z_{ch}$ (from the transmission line model or memory 330 of FIG. 3) to compute the junction voltage at the cable out end, $V_{junction}(f_1)$ and admittance $Y_{junction}(f_1)$. A junction current ALU 510 of the transmission line transformation processor 320 may compute the current $I_{junction}(f_1)$ at the junction of the coaxial cable 210 and the grid 62 (FIG. 1A) as described by Equation 8

$$I_{junction}(f_1) = I_{in}(f_1) * \cosh\left[\frac{(V_{ch}(f_1))}{(-\text{length})}\right] + \left(\frac{V_{in}(f_1)}{Z_{ch}}\right) * \sinh\left[\frac{(V_{ch}(f_1))}{(-\text{length})}\right]. \tag{8}$$

Additionally, a junction voltage ALU 520 may compute the voltage $V_{junction}(f_1)$ at the junction between the coaxial cable 210 and the grid 62 as described by Equation 9:

$$V_{junction}(f_1) = V_{in}(f_1) * \cos h[(V_{ch}(f_1))(-\text{length})] + (I_{in}(f_1)) \\ * Z_{ch}) * \sin h[(V_{ch}(f_1))(-\text{length})] \tag{9}.$$

A divider 530 may receive the output, $I_{junction}(f_1)$, of the junction current ALU 510 and the output, $V_{junction}(f_1)$, of the junction voltage ALU 520 and compute the junction admittance $Y_{junction}(f_1)$, as described by Equation 10.

$$Y_{junction}(f_1) = \frac{I_{junction}(f_1)}{V_{junction}(f_1)}. \tag{10}$$

It should be noted that each of the electrical quantities in the foregoing computations (current, voltage, impedance, admittance, etc.) may be a complex number having both a real part and an imaginary part.

Figure 6:
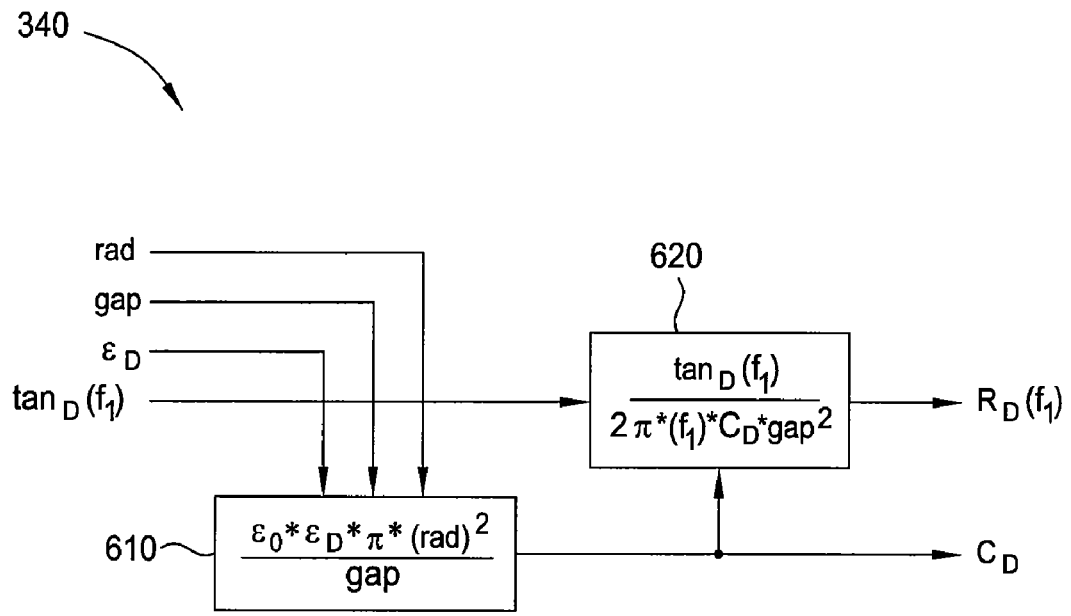
FIG. 6 illustrates an embodiment of a grid-to-ground transformation processor in the measurement instrument LF section of FIG. 3.

FIG. 6 illustrates an embodiment of the structure of the grid-to-ground transformation processor 340 of FIG. 3. The grid-to-ground transformation processor 340 may receive a set of parameters (e.g., the gap, dielectric constant $\in_D$, $\tan_D(f_1)$, and rad (the wafer radius)) from the grid-to-ground model or memory 345 of FIG. 3. The grid-to-ground transformation processor 340 may then compute the dielectric resistance $R_D(f_1)$ and the dielectric capacitance $C_D$. The dielectric capacitance $C_D$ may be computed by a $C_D$ ALU 610 as described by Equation 11:

$$C_D = \frac{\varepsilon_0 * \varepsilon_D * \pi * (\text{rad})^2}{\text{gap}}, \tag{11}$$

where $\in_0$ is the electrical permittivity of free space. Additionally, the grid-to-ground transformation processor 340 may employ an $R_D$ ALU 620 to compute the dielectric resistance $R_D(f_1)$ as described by Equation 12:

$$R_D(f_1) = \frac{\tan_D(f_1)}{2\pi * (f_1) * C_D * \text{gap}^2}. \tag{12}$$

Figure 7:
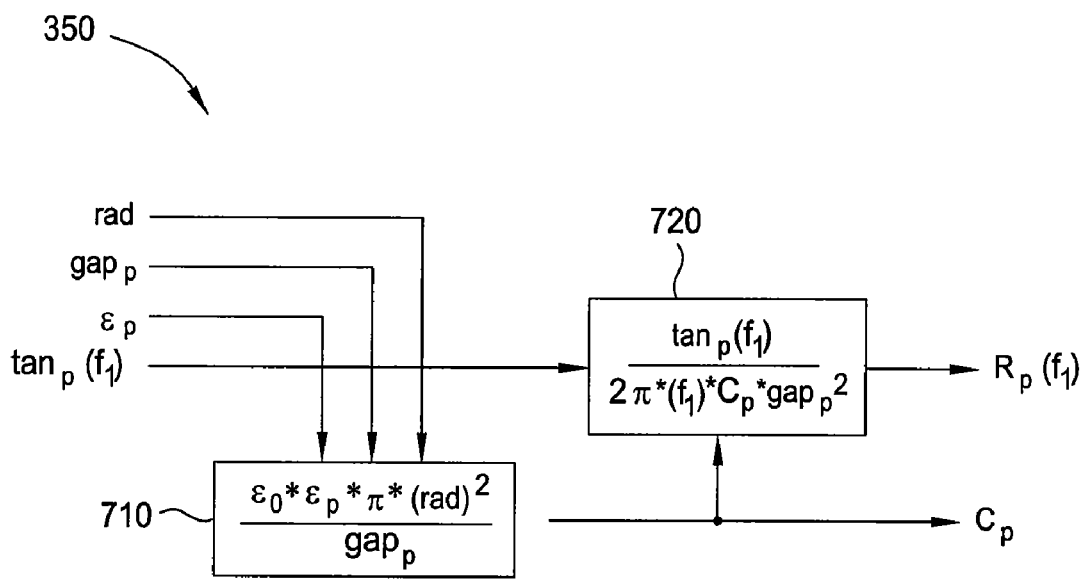
FIG. 7 illustrates an embodiment of a grid-to-wafer transformation processor in the measurement instrument LF section of FIG. 3.

FIG. 7 illustrates an embodiment of the structure of the grid-to-wafer transformation processor 350 of FIG. 3. The grid-to-wafer transformation processor 350 may receive a set of parameters (e.g., $\text{gap}_P$, dielectric constant $\in_P$, $\tan_P(f_1)$, and rad) from the grid-to-wafer model or memory 355 of FIG. 3. The grid-to-wafer transformation processor 350 may then compute the plasma resistance $R_P(f_1)$ and the plasma capacitance $C_P$. The plasma capacitance $C_P$ may be computed by a $C_P$ ALU 710 as described by Equation 13:

$$C_P = \frac{\varepsilon_0 * \varepsilon_P * \pi * (\text{rad})^2}{\text{gap}_P}, \tag{13}$$

where $\in_0$ is the electrical permittivity of free space. Additionally, the grid-to-wafer transformation processor 350 may employ an $R_P$ ALU 720 to compute the plasma resistance $R_P(f_1)$ as described by Equation 14:

$$R_P(f_1) = \frac{\tan_P(f_1)}{2\pi * (f_1) * C_P * \text{gap}_P^2}. \tag{14}$$

Figure 8:
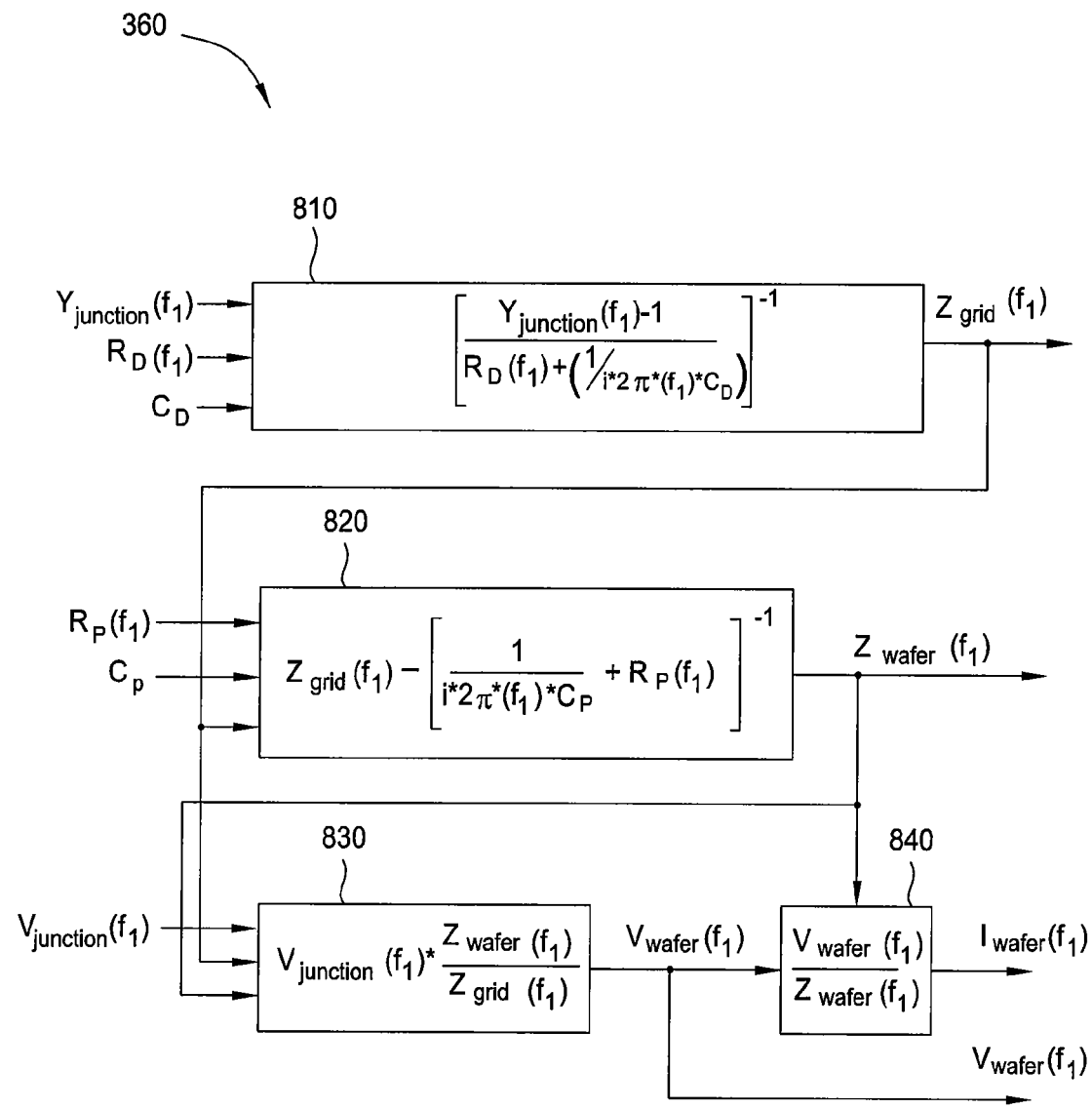
FIG. 8 illustrates an embodiment of a combined transformation processor in the measurement instrument LF section of FIG. 3.

FIG. 8 illustrates an embodiment of the structure of the combined transformation processor 360 of FIG. 3. The combined transformation processor 360 may receive a set of parameters (e.g., $R_D(f_1)$ and $C_D$ from the processor 340, $R_P(f_1)$ and $C_P$ from the processor 350, and $Y_{junction}(f_1)$ from the processor 320) and employ a grid impedance ALU 810 to compute the impedance at the grid 62, $Z_{grid}(f_1)$, as described by Equation 15:

$$Z_{grid}(f_1) = \left[\frac{Y_{junction}(f_1) - 1}{R_D(f_1) + (1/i * 2\pi * (f_1) * C_D)}\right]^{-1}. \tag{15}$$

Additionally, the combined transformation processor 360 may employ a wafer impedance ALU 820 to compute the impedance at the wafer 40, $Z_{wafer}$, as described by Equation 16:

$$Z_{wafer}(f_1) = Z_{grid}(f_1) - \left[\frac{1}{i * 2\pi * (f_1) * C_P} + R_P(f_1)\right]^{-1}. \tag{16}$$

The combined transformation processor 360 may also employ a wafer voltage ALU 830 to compute the voltage on the wafer, $V_{wafer}(f_1)$, as described by Equation 17:

$$V_{wafer}(f_1) = V_{junction}(f_1) * \frac{Z_{wafer}(f_1)}{Z_{grid}(f_1)}. \tag{17}$$

If desired, a processor 840 of the combined transformation processor 360 may produce a measured wafer current $I_{wafer}(f_1)$ by dividing the wafer voltage $V_{wafer}(f_1)$ by the wafer impedance $Z_{wafer}(f_1)$.

It should be noted that the exact computation of $Z_{grid}(f_1)$ may indirectly depend upon both $V_{in}(f_1)$ and $I_{in}(f_1)$. For example, $Z_{grid}(f_1)$ is dependent on $Y_{junction}(f_1)$, which is dependent on $V_{junction}(f_1)$ and $I_{junction}(f_1)$, which are both dependent on $V_{in}(f_1)$ and $I_{in}(f_1)$, as described above. Consequently, $Z_{grid}(f_1)$ is not necessarily a constant. In order to simplify the computation of the wafer voltage $V_{wafer}(f_1)$, the factor $Z_{wafer}(f_1)/Z_{grid}(f_1)$ may be ignored (i.e., assigned a value of unity). Alternatively, the computation may be simplified by choosing an average value of $Z_{grid}(f_1)$ within an applicable operating process window as a constant to replace the exact computation of $Z_{grid}(f_1)$, in the determination of $V_{wafer}(f_1)$. With this simplification, the factor $Z_{wafer}(f_1)/Z_{grid}(f_1)$ becomes a constant, so that the determination of the wafer voltage $V_{wafer}(f_1)$ by ALU 360 becomes multiplication of the cable/electrode junction voltage $V_{junction}(f_1)$ by a constant (i.e., by the factor $Z_{wafer}(f_1)/Z_{grid}(f_1)$). This may reduce the accuracy slightly but has the advantage of simplifying the computation of $V_{wafer}(f_1)$.

The HF Measurement Instrument Section 140b

Additionally, embodiments discussed herein may include separate and distinct hardware and/or software for determining the HF wafer voltage $V_{wafer}(f_2)$. In such embodiments, the hardware and/or software may found in the measurement instrument section 140b. Accordingly, the measurement instrument section 140b may contain components similar to those found in measurement instrument section 140a (e.g., a transmission line transformation processor, a grid-to-ground transformation processor, a grid-to-wafer transformation processor, a combined transformation processor, etc.), as described above. These components may perform operations parallel to those previously described. For example, the components found in measurement instrument section 140b may calculate an HF input current $I_{in}(f_2)$, an HF input voltage $V_{in}(f_2)$, a dielectric resistance $R_D(f_2)$, a dielectric capacitance $C_D$, a plasma resistance $R_P(f_2)$, a plasma capacitance $C_P$, an HF wafer impedance $Z_{wafer}(f_2)$, an HF grid impedance $Z_{grid}(f_2)$, an HF complex phase velocity $V_{CH}(f_2)$, an HF wafer current $I_{wafer}(f_2)$, and a HF wafer voltage $V_{wafer}(f_2)$.

Determination of the Constants Used by the Processors of FIG. 1A

The two measurement instrument sections 140a, 140b may provide the LF and HF components of the wafer voltage $V_{wafer}(f_1)$, $V_{wafer}(f_2)$, respectively. These two components may be used in the processor of FIG. 1B to compute the total wafer D.C. voltage while accounting for voltage losses due to intermodulation between the two frequencies, as described above with reference to FIG. 1B. The LF constants $K_1(f_1)$, $K_2(f_1)$, which may be employed by the processor 90 of FIG. 1B to determine the LF component of the wafer voltage, are defined in accordance with the disclosure of FIGS. 3, 4, 5, 6, 7 and 8 as described in Equations 18 and 19:

$$K_1(f1) = \left(\frac{Z_{wafer}(f1)}{Z_{grid}(f1)} * \cosh[V_{CH}(f1)(-\text{length})]\right), \tag{18}$$

$$K_2(f1) = \left(\frac{Z_{wafer}(f1)}{Z_{grid}(f1)} * \frac{1}{Z_{CH}} * \sinh[V_{CH}(f1)(-\text{length})]\right). \tag{19}$$

Additionally, the HF constants $K_1(f_2)$, $K_2(f_2)$, which may be employed by the processor 91 of FIG. 1B to determine the HF component of the wafer voltage, are described by Equations 20 and 21:

$$K_1(f2) = \left(\frac{Z_{wafer}(f2)}{Z_{grid}(f2)} * \cosh[V_{CH}(f2)(-\text{length})]\right), \tag{20}$$

$$K_2(f2) = \left(\frac{Z_{wafer}(f2)}{Z_{grid}(f2)} * \frac{1}{Z_{CH}} * \sinh[V_{CH}(f2)(-\text{length})]\right). \tag{21}$$

Figure 9:
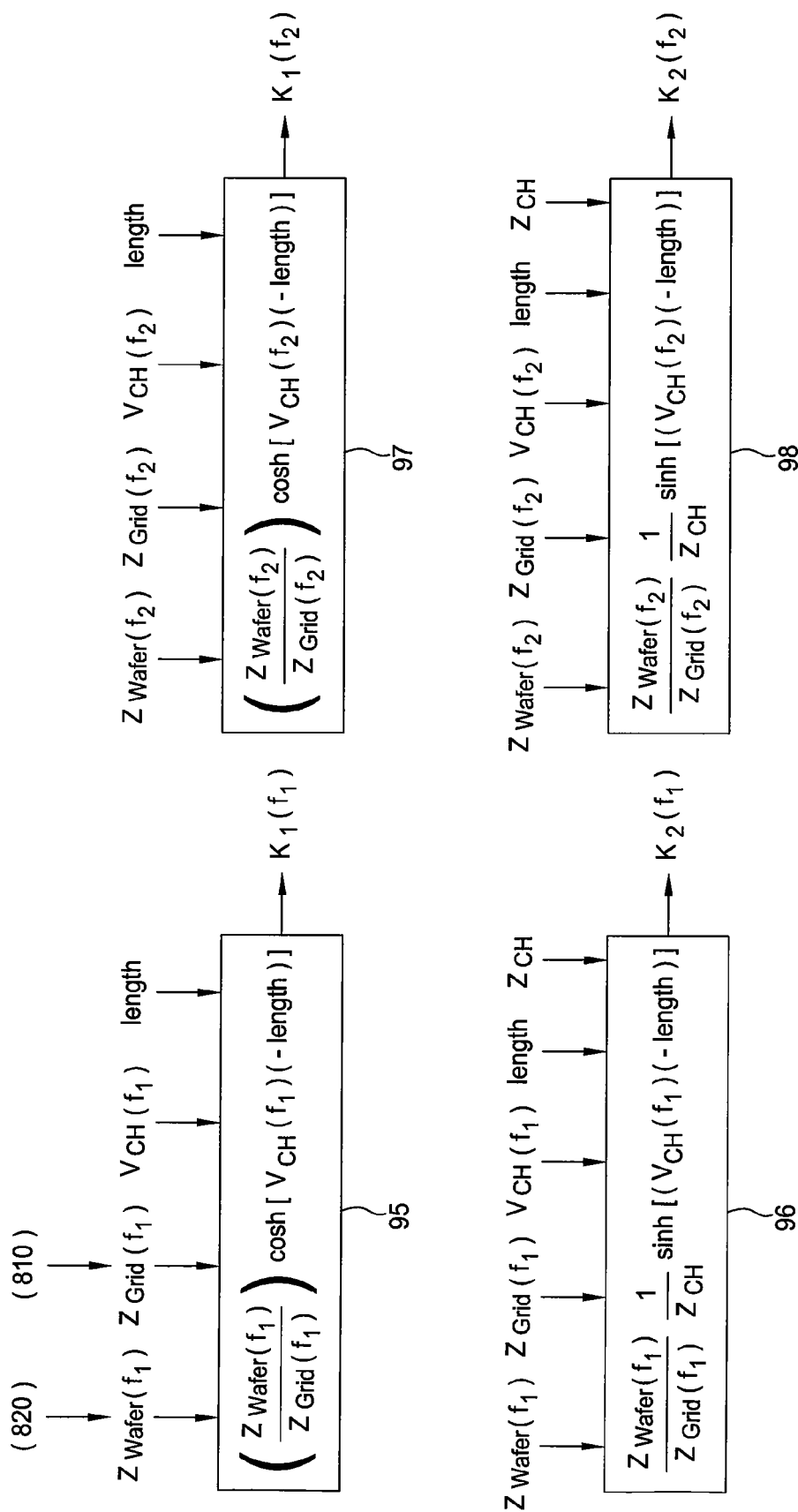
FIG. 9 illustrates an embodiment of an apparatus for providing constants or factors employed by the measurement instrument of FIG. 1A.

FIG. 9 depicts processors 95, 96, 97, 98 for producing the constants $K_1(f_1)$, $K_2(f_1)$, $K_1(f_2)$, $K_2(f_2)$, respectively. For the processors 95 and 96, the values of $Z_{wafer}(f_1)$ and $Z_{grid}(f_1)$ may come from the processors 820 and 810, respectively (of FIG. 8), as indicated in FIG. 9. For the processors 97 and 98, the values of $Z_{wafer}(f_2)$ and $Z_{grid}(f_2)$ may come from the parallel hardware found in measurement instrument section 140b, as indicated in FIG. 9. These constants may be stored in the registers 90a, 90b, 91a, 91b, respectively, of FIG. 1B.

Three Bias Power Frequencies for Enhanced Etch Performance

In some embodiments the reactor of FIG. 1A may employ two bias power frequencies, namely $f_1$ and $f_2$, and a source frequency, $f_3$, in order to optimize etch performance. In certain embodiments, the first and second bias power frequencies (i.e., $f_1$ and $f_2$) may be provided to the bottom electrode 62 by RF bias power generators 125 and 125', as described above, allowing for the corresponding bias voltages (i.e., $V_{RF}(f_1)$ and $V_{RF}(f_2)$) to be determined as previously described. However, the source frequency $f_3$ may be provided to the upper electrode 12 (i.e., the chamber ceiling), and, consequently, determination of a corresponding source voltage $V_{RF}(f_3)$ may be difficult.

For example, since the RF bias power from the third source is provided to the upper electrode 12, measurements from the bias power impedance match circuit 130 and measurement instrument 140 may not be utilized. However, embodiments discussed herein may enable a processor to calculate an electron temperature $T_e$, plasma density n, and current I by solving the ionization equation, the equation of state, and a set of power balance equations in an iterative manner. These equations are described by Equations 22-30:

$$K_{iz} n_g d = 2\sqrt{\frac{k_B * T_e}{M}}, \tag{22}$$

$$p = n_g k_B T, \tag{23}$$

$$d = l - (s_P + s_g), \tag{24}$$

$$s_P = \frac{I}{en\varpi A_P}, \quad s_g = \frac{I}{en\varpi A_g}, \tag{25}$$

$$P_{Ohmic} = \frac{1}{2} \frac{mv_m I^2}{e^2 n} \frac{l}{A_P - A_g} \ln\frac{A_P}{A_g}, \tag{26}$$

-continued $$P_{stoch} = \frac{1}{2} \frac{m \bar{v}_e I^2}{e^2 n} \frac{A_p + A_g}{A_p A_g}, \quad (27)$$

$$P_e = P_{Ohmic} + P_{Stoch} \quad (28)$$

$$= e * n \sqrt{\frac{k_B * T_e}{M}} * (\varepsilon_c + \alpha T_e) * (A_g + A_p),$$

$$P_i = e * n \sqrt{\frac{k_B * T_e}{M}} * (A_g * V_g + A_p * V_p), \quad (29)$$

$$P_{tot} = P_e + P_i = P_{applied}. \quad (30)$$

The current I, plasma density n, and plasma sheath thicknesses $s_p$ and $s_g$ may be obtained by assuming an initial plasma width d and then solving the power balance equations. Subsequently, the new d, obtained from $d=l-(s_p+s_g)$, where l is inter-electrode gap, may be used for next iteration. This process may be repeated until d converges. In certain instances, d may converge after 6 iterations.

Once d converges, the processor may then derive the bias voltage $V_{RF}(f_3)$ corresponding to the source frequency $f_3$ from the plasma density and plasma sheath thickness previously determined by solving the set of power balance equations. To derive $V_{RF}(f_3)$, the processor may employ Equation 31:

$$V_{RF}(f3) = \frac{2*e*n*s_g^2}{\varepsilon_0}. \quad (31)$$

Additionally, accounting for intermodulation effects, as previously described, remains difficult. For example, in determining the D.C. wafer voltage in a dual bias power frequency system the processor 80 could employ Equation 2 and accurately account for the intermoduation effects that resulted from two bias power frequencies. However, to account for the intermodulation effects present in a three-frequency system, a processor 94 may need to employ a more complex equation. Under certain, mild conditions (e.g., high pressure, low power conditions) the processor 94 may employ Equation 32 in predicting the D.C. voltage on the wafer:

$$V_{DC} = \quad \text{Equation 32}$$

$$-\frac{3}{4} \frac{\left(\frac{A_g}{A_p}\right)^2 - 1}{\left(\frac{A_g}{A_p}\right)^2 + 1} * \left[\begin{array}{c} V_{DC}(f1) + V_{DC}(f2) + V_{DC}(f3) - \\ \left(\begin{array}{c} V_{DC}(f1)*V_{DC}(f2) + V_{DC}(f1)* \\ \frac{V_{DC}(f3) + V_{DC}(f2)*V_{DC}(f3)}{\frac{2}{3} * \frac{V_{DC}(f3) + V_{DC}(f2)*V_{DC}(f3)}{V_{DC}(f1) + V_{DC}(f2) + V_{DC}(f3)}} \end{array}\right) \end{array}\right].$$

However, certain embodiments discussed herein may employ low pressure and high power in the processing chamber. Therefore, Equation 22 may not be an optimal solution for these more extreme conditions. In embodiments which employ more extreme conditions, the processor 94 may utilize Equation 33 in predicting the D.C. voltage on the wafer:

$$V_{DC} = \quad \text{Equation 33}$$

$$-\frac{3}{4} * F_1 * \frac{F_2 - 1}{F_2 + 1} * \left[\begin{array}{c} V_{DC}(f1) + V_{DC}(f2) + V_{DC}(f3) - \\ \left(\begin{array}{c} F_3 * V_{DC}(f1) * V_{DC}(f2) + \\ F_4 * V_{DC}(f1) * V_{DC}(f3) + \\ \frac{2}{3} * \frac{F_5 * V_{DC}(f2) * V_{DC}(f3)}{V_{DC}(f1) + V_{DC}(f2) + V_{DC}(f3)} \end{array}\right) \end{array}\right],$$

wherein $f_1$-$F_5$ are described by Equations 34-38, respectively.

$$F_1 = 1.2 - 3.3 * p^2 \quad (34)$$

$$F_2 = \left(\frac{A_g}{A_p}\right)^{4-0.2*p^3} \quad (35)$$

$$F_3 = \left(\frac{P(f1)*P(f2)}{P(f1)+P(f2)}\right)^{0.06} \quad (36)$$

$$F_4 = (P(f1))^{0.39} \quad (37)$$

$$F_5 = (P(f2))^{0.22} \quad (38)$$

In Equations 34-38 'p' may be understood to represent the pressure within the processing chamber, $A_g$ may be understood to represent the area of the grounded electrode(s), $A_p$ may be understood to represent the area of the powered electrode(s), $P(f_1)$ may be understood to represent the power from the first bias frequency, while $P(f_2)$ may be understood to represent the power from the second bias frequency. By utilizing Equations 24-38 in the real-time prediction of the D.C. voltage on the wafer, embodiments discussed herein may more accurately account for effects resulting from changes in the chamber pressure or bias frequency powers.

In a highly efficient implementation, phase information from the sensor 132 may not be required. In this implementation, the phase processor 310 may not be employed and the sensor voltages and currents $V(f_1)$, $I(f_1)$, $V(f_2)$, $I(f_2)$ may be multiplied by the constants stored in the registers 90*a*, 90*b*, 91*a*, 91*b* in the manner shown in FIG. 1B. In order to ensure that $K_1(f_1)$, $K_2(f_1)$, $K_1(f_2)$, $K_2(f_2)$ are true constants, the quantity $Z_{grid}$, may be replaced by an average value of $Z_{grid}$ applicable over a predicted operating process window, as mentioned previously in this specification.

While each operation performed in the measurement instrument 140 has been described with respect to a separate processor, several of the processors within the measurement instrument 140 may be realized in a single processor whose resources are shared to perform the different operations at different times. In some embodiments, all of the processors in the measurement instrument 140 may be realized by a single processor that is a shared resource among the different operations performed by the measurement instrument, so that the measurement instrument 140 may be realized as computer using a central processing unit (CPU) to perform all the operations.

The phase processor 310 may transform the measured values of the voltage and current sensed by the sensor 132 into input voltages and currents $V_{in}(f_1)$, $I_{in}(f_1)$, $V_{in}(f_2)$, $I_{in}(f_2)$. For purposes of the claims below, therefore, the phase processor 310 may be considered to be part of the sensor 132, so that the outputs $V_{in}(f_1)$, $I_{in}(f_1)$, $V_{in}(f_2)$, $I_{in}(f_2)$ of the phase processor 310 are considered as the measured voltages and currents from the sensor 132. In fact, in some cases it may be possible to eliminate or completely bypass the phase processors 310.

The use of stored constants $K_1(f_1)$, $K_2(f_1)$, $K_1(f_2)$, $K_2(f_2)$ may greatly simplify the computations of the wafer voltage frequency components by reducing them to simple multiplications of the sensed current and voltage by respective constants and summations of the resulting products. This makes it unnecessary to measure phase in order to determine the wafer voltage.

ADVANTAGES OF THE DISCLOSED EMBODIMENTS

The embodiments discussed herein may be used with a Johnson-Raybeck ESC (i.e., the type of ESC depicted in FIG. 1A) in an etch process to control the wafer D.C. voltage so accurately that the bias power may be increased to the capacity of the ESC (e.g., 10 kW) at a very high wafer temperature (e.g., 60 degrees C.) for straighter etch profile at a very low chamber pressure (e.g., 5 mT) for better etch selectivity. The heat transfer from the wafer is regulated by controlling the electrostatic clamping force, as described above. Without the accurate measurement and control of the wafer D.C. voltage provided in embodiments discussed herein, the risk in running such high wafer bias power is that an error in the wafer D.C. voltage may cause one of two catastrophic events: (1) if the D.C. wafer voltage is too small, the wafer may be inadequately clamped so that its temperature rises out of control or the wafer may be released from the ESC; (2) if the D.C. wafer voltage is too great, the wafer may be over-clamped, leading to process failure by excessive D.C. wafer current. The problem is that, while a Johnson-Raybeck ESC can tolerate very high wafer bias power levels (e.g., 10 kW) at low chamber pressure (e.g., 5-10 mT) without breaking down, its insulator layer becomes very lossy at the high temperatures desired for etching, requiring more bias power to maintain a given D.C. wafer voltage, leading to higher wafer current. Conventional applications avoid this by limiting the wafer temperature or the wafer bias voltage (or both) to prevent any error in the wafer D.C. voltage from exceeding the permissible limits. However, embodiments discussed herein monitor the wafer D.C. voltage (and current) in real-time with great accuracy in a completely non-invasive manner. With control feedback to the bias power level, the wafer D.C. voltage and (hence) the wafer clamping voltage can be taken near the permissible limits (i.e., near maximum wafer current limits or near the minimum clamping voltage) with any violation of those limits prevented by a real time feedback control system between accurate wafer D.C. voltage measurement and the RF bias power level. As a result, the bias power can be increased to a very high level (e.g., 10 kW) at relatively low chamber pressure (e.g., 5 mT) at a high wafer temperature (e.g., 60 degrees C.). These process parameter values define a new high performance etch process window that has been unattainable until the embodiments discussed herein.

While the invention has been described in detail by specific reference to preferred embodiments, it is understood that variations and modifications thereof may be made without departing from the true spirit and scope of the invention.

The invention claimed is:

1. A method of processing a wafer while controlling an electrostatic chuck clamping voltage, comprising:
    applying a first RF current to the electrostatic chuck through an RF match network at a first frequency from a first RF power source;
    applying a second RF current to the electrostatic chuck through the RF match network at a second frequency from a second RF power source;
    applying DC voltage to the electrostatic chuck;
    measuring a third RF current at the match network attributable to the first frequency;
    measuring a fourth RF current at the match network attributable to the second frequency;
    calculating a wafer voltage at the first and second frequencies based upon the measured third and fourth currents;
    calculating a DC component of the wafer voltage attributed to each frequency;
    calculating a total DC voltage at the wafer based upon the DC component attributable to each frequency and a DC component attributable to an intermodulation of the first and second frequency; and
    adjusting the applied DC voltage to maintain a predetermined difference between the applied DC voltage and the total DC voltage at the wafer.

2. The method of claim 1, further comprising flowing a cooling fluid through the electrostatic chuck.

3. The method of claim 1, further comprising etching the wafer.

4. The method of claim 1, wherein the wafer is disposed in a plasma reactor having a grounded gas distribution showerhead.

5. The method of claim 4, further comprising flowing a cooling fluid through the electrostatic chuck.

6. The method of claim 4, wherein the total DC voltage at the wafer is calculated using the equation:

$$V_{DC} = -\frac{3}{4} * \frac{\left(\frac{A_g}{A_p}\right)^2 - 1}{\left(\frac{A_g}{A_p}\right)^2 + 1}\left[V_{RF}(f1) + V_{RF}(f2) - \frac{2}{3}\frac{V_{RF}(f1) * V_{RF}(f2)}{V_{RF}(f1) + V_{RF}(f2)}\right],$$

where $A_g$ represents an area of the gas distribution showerhead, $A_p$ represents an area of the electrostatic chuck, $V_{RF}(f1)$ represents the DC component of the wafer voltage attributed to the first frequency, and $V_{RF}(f_2)$ represents the DC component of the wafer voltage attributed to the second frequency.

7. The method of claim 6, further comprising flowing a cooling fluid through the electrostatic chuck.

8. The method of claim 6, further comprising etching the wafer.

* * * * *